United States Patent [19]
Liu et al.

[11] Patent Number: 5,602,476
[45] Date of Patent: Feb. 11, 1997

[54] ULTRA-FAST MR IMAGING DATA ACQUISITION SCHEME USING MIXED BANDWIDTH DATA

[75] Inventors: Haiying Liu, Euclid; Rao P. Gullapalli; Mark J. Loncar, both of Richmond Heights, all of Ohio

[73] Assignee: Picker International, Inc., Highland Heights, Ohio

[21] Appl. No.: 516,386

[22] Filed: Aug. 17, 1995

[51] Int. Cl.$^6$ ................................................ G01R 33/20
[52] U.S. Cl. ............................................................ 324/309
[58] Field of Search .................................... 324/307, 309, 324/300, 314, 312; 128/653.2

[56] References Cited

U.S. PATENT DOCUMENTS

| | | | |
|---|---|---|---|
| 4,792,758 | 12/1988 | Sattin | 324/309 |
| 4,833,407 | 5/1989 | Holland et al. | 324/309 |
| 4,859,945 | 8/1989 | Stokar | 324/309 |
| 4,896,113 | 1/1990 | Pelc | 324/309 |
| 4,901,020 | 2/1990 | Ladebeck et al. | 324/309 |
| 4,952,876 | 8/1990 | Pelc | 324/309 |
| 4,959,611 | 9/1990 | Brovost et al. | 324/309 |
| 4,970,465 | 11/1990 | Hagiwara | 324/309 |
| 5,043,665 | 8/1991 | Kuhara et al. | 324/309 |
| 5,084,675 | 1/1992 | Reinfelder et al. | 324/300 |
| 5,168,226 | 12/1992 | Hinks | 324/309 |
| 5,168,228 | 12/1992 | Mansfield et al. | 324/309 |
| 5,189,371 | 2/1993 | Conolly et al. | 324/309 |
| 5,270,654 | 12/1993 | Feinberg et al. | 324/309 |
| 5,311,133 | 5/1994 | Dannels | 324/309 |
| 5,348,011 | 9/1994 | NessAiver | 128/653.2 |

OTHER PUBLICATIONS

"Double–Echo Phase–Sensitive Method for Fat Suppression MRI", Szumowski, et al., p. 418 (1994).
"GRASE (Gradient and Spin–Echo) MR Imaging: A New Fast Clinical Imaging Technique", Feinberg, Radiology 1991; 181:597–602.
"Separation of True Fat and Water Images by Correcting Magnetic Field Inhomogeneity in Situ", Yeung, et al., Radiology 1986; 159:783–786.
"Three–Point Dixon Technique for True Water/Fat Decomposition with $B_0$ Inhomogeneity Correction", Glover, Mag. Res. n Med., 18, 371–383 (1991).
"Prostatic MR Imaging Performed with the Three–Point Dixon Technique" Tamler, et al., Radiology 1991; 179:43–47.
"Fat–Suppression MR IMaging in Neuroradiology: Techniques and Clinical Application", Tien, AJR 158:369–379, Feb. 1992.
"A Novel Three Point Technique for Separation of Water/Fat Using the Fast Spin Echo Technique", Gullapalli, et al., 1994 Abstract SMRM.
"Zonally Magnified EPI in Real Time by NMR", Mansfield, et al., J. Phys. E:Sci. Instrum. 21 (1988) 275–280.
"Echo Planar—Inner Volume Imaging at 0.35T", Feinberg, et al., Radiologic Imaging Laboratory, Univ. of CA, vol. 161 (1986) pp. 950.

Primary Examiner—Sandra L. O'Shea
Assistant Examiner—Raymond Y. Mah
Attorney, Agent, or Firm—Fay, Sharpe, Beall, Fagan, Minnich & McKee

[57] ABSTRACT

In a magnetic resonance imaging system, a read gradient scaler (102) scales the amplitude and width of read gradients (78, 82, 84). A sampling rate control (104) controls the sampling rate of the resonance signals received from corresponding magnetic resonance echoes (80 54, 86). For example, when the amplitude of the gradient pulse is doubled and its width halved, the sampling rate of the resultant magnetic resonance signal is doubled, e.g., from a bandwidth of 32 MHz to a bandwidth of 64 MHz. In this manner, some echoes are read-out over a longer period of time with a lower bandwidth to produce lower signal-to-noise data lines; whereas, other echoes are much shorter and are read-out more quickly, but with a lower signal-to-noise ratio. The phase-encoding gradients (74, 88, 90) are controlled (70) such that the resultant data lines with the lowest bandwidth have the lowest phase-encoding angles closest to the zero phase-encoding and the data lines with the highest bandwidth have the highest phase-encoding angles closest to the negative and positive maximum phase-encoding gradients. The data lines are sorted (110) by phase encode angle and bandwidth and reconstructed (120) into an image representation.

16 Claims, 4 Drawing Sheets

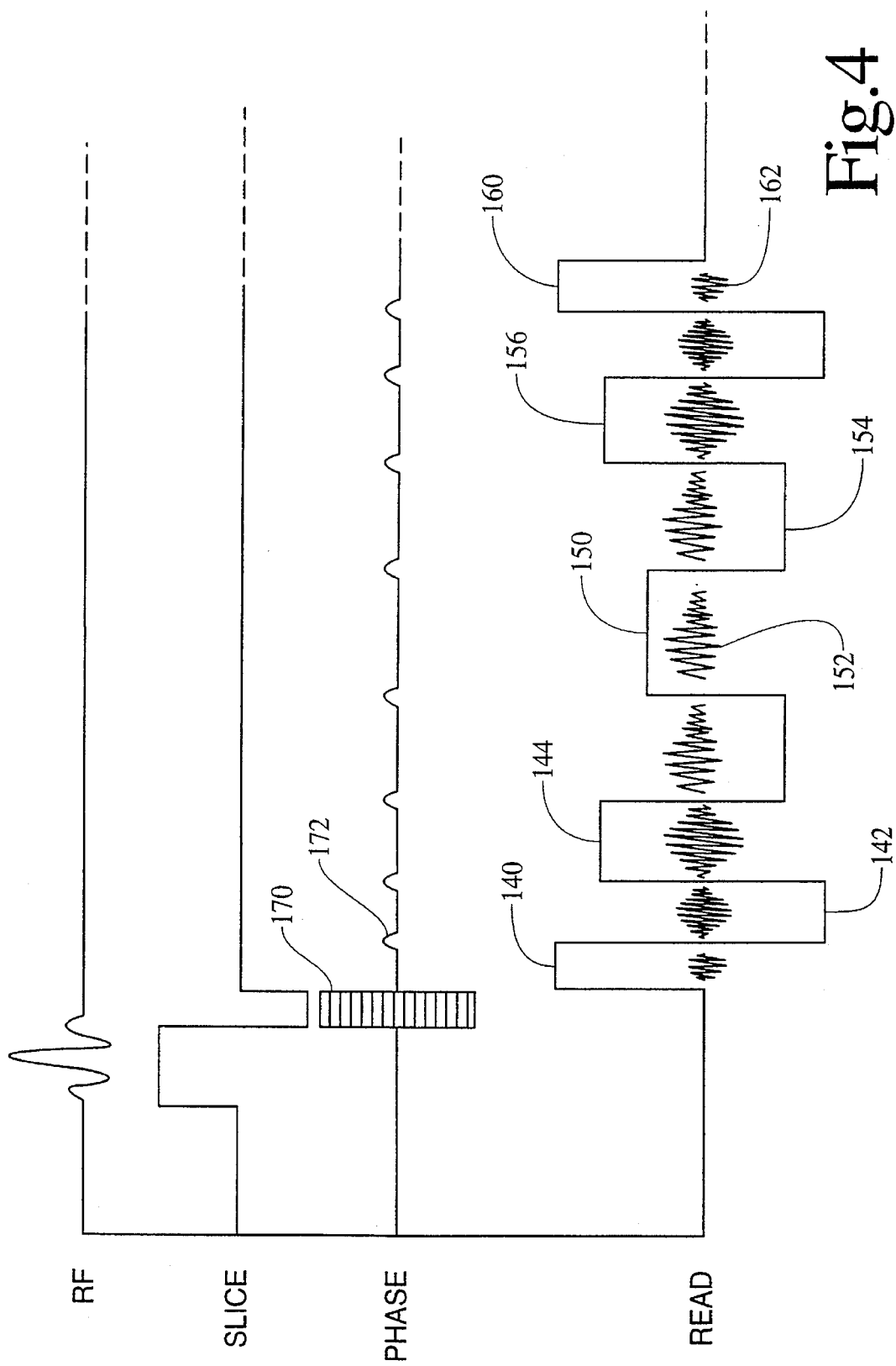

ULTRA-FAST MR IMAGING DATA ACQUISITION SCHEME USING MIXED BANDWIDTH DATA

BACKGROUND OF THE INVENTION

The present invention relates to the magnetic resonance arts. It finds particular application in conjunction with echo-planar (EPI) and gradient and spin echo (GSE) imaging techniques and will be described with particular reference thereto. However, it is to be appreciated that the present technique is also applicable to other rapid imaging sequences including spin echo and field echo, as well as a multiple-echo sequences.

Heretofore, subjects have been positioned in a temporally constant magnetic field such that selected dipoles preferentially align with the magnetic field. Radio frequency signals have been applied to cause the preferentially aligned dipoles to resonate and emit resonance signals of a characteristic radio frequency. The radio frequency magnetic resonance signals from the resonating dipoles are read out for reconstruction into an image representation.

To strengthen the magnetic resonance signals, the resonance signal is commonly refocused into an echo. A spin echo is generated by following a radio frequency excitation pulse with a 180° refocusing pulse which causes the resonating spin system to refocus as a spin echo. The time between the refocusing pulse and the spin echo is the same as the time between the excitation pulse and the refocusing pulse. Other disturbances to the spin system can also be used to induce an echo. For example, reversing the polarity of the magnetic field, particularly the read gradient of the magnetic field, induces a field or gradient echo. Various techniques have been developed for causing a plurality of echoes sequentially following a single excitation. The echoes may include a series of spin echoes, a series of field echoes, or a mixture of field and spin echoes. See, for example, U.S. Pat. No. 4,833,408 of Holland, et al.

Traditionally, spatially-encoded magnetic resonance data for image reconstruction uses the same data sampling rate or bandwidth for every one of a multiplicity of views. The analog-to-digital converter is designed and controlled such that it only converts analog resonance signals (either before or after demodulation) with a fixed frequency for each of 256×256 pixel images, 512×512 pixel images, etc. In reconstruction backprojection, each view of magnetic resonance data is collected during a spin or field echo in the presence of a read gradient that frequency encodes spatial position within the object in the direction of the gradient. A series of like acquisitions are repeated, rotating the gradient, but maintaining its amplitude constant with a constant data sampling rate. In two-dimensional Fourier transform imaging, the read gradient is held stationary rather than rotating, but is proceeded by a phase-encode gradient pulse in a direction orthogonal to the read gradient. Although the amplitude of the phase encode gradient was stepped to adjust the phase encoding from view to view, the magnitude of the read-out gradient was held constant with a constant data sampling rate. The scheme of data lines with different phase-encodings are typically denoted as k-space data. That is, in k-space, the data line with zero phase-encoding generally extends across the center of k-space. Data lines with the phase-encoding gradient stepped in progressive positive steps are generally depicted as being above the centerline of k-space, and data lines with progressive negative phase-encode steps are depicted as below the centerline of k-space.

Typically, k-space has 256, 512, etc. data lines. The data lines are typically sampled the same 256, 512, etc. times to make a square k-space matrix that is Fourier transformed into a square image.

To speed up the data acquisition, segmented k-space schemes have been developed in which each excitation is followed by a plurality of data acquisitions. For example, a series of field echoes are generated by rapidly reversing the read-out gradient, e.g., an oscillating read-out gradient of constant amplitude, to produce a series of data lines in k-space following each excitation or shot. If the oscillating read gradient is fast enough, an entire image of data can be acquired with a single excitation, i.e., a single shot technique. Alternately, as illustrated in the above-referenced Holland patent, each excitation can be followed by a smaller plural number of data acquisition intervals corresponding to a combination of field and spin echoes. The spin and field echoes are collected with a common bandwidth or sampling rate, but are sorted into different segments of k-space to improve image quality. For example, the first echo following each excitation can be placed in the central portion of k-space which contributes more strongly to the resultant image than the data taken at the maximum and minimum phase encode gradients.

A common feature of the above-discussed prior art is that they use identical data sampling bandwidths for the data acquisition of all echoes. Particularly, for narrow bandwidth data acquisitions, the phase error resulting from the local magnetic field inhomogeneity is more significant between different echoes of a repeated echo sequence. Although spin echoes are relatively insensitive to field inhomogeneities, field echoes are affected by field inhomogeneities which results in a $T_2^*$ decay of the signal. The greater the time interval between the spin and field echoes, the greater the phase mismatch between the field and spin echoes due to the $T_2^*$ decay. In general, the narrower the read bandwidth of the echoes, the more dramatic is the effect of field inhomogeneities. Moreover, the negative effect increases in severity as additional field and spin echo sets are collected following each of a series of 180° inversion pulses. Although post-processing methods exist to correct for some of these phase differences, the methods are not completely reliable and tend to introduce some loss in resolution in the final image.

The present invention is directed to a new and improved data acquisition technique which overcomes the above-referenced problems and others.

SUMMARY OF THE INVENTION

In accordance with the present invention, a data acquisition technique is provided in which the bandwidth of data acquisition is changed between at least two data acquisition rates from echo to echo within a common image. The data is ordered in k-space such that the data with the lowest bandwidth is disposed adjacent the center of k-space and data at the higher bandwidth is located nearer the edges of k-space.

In accordance with another aspect of the present invention, a multiple-echo imaging sequence is provided in which each resonance excitation pulse is followed by at least one spin echo and at least one field echo. The spin echo data is acquired at a lower bandwidth than the field echo data.

One advantage of the present invention is that it opens a whole new avenue of design flexibility for magnetic resonance imaging sequence optimization.

Another advantage of the present invention is that it reduces $T_2^*$ related phase errors in multiple-echo imaging sequences.

Another advantage of the present invention resides in the accelerated data acquisition rate.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
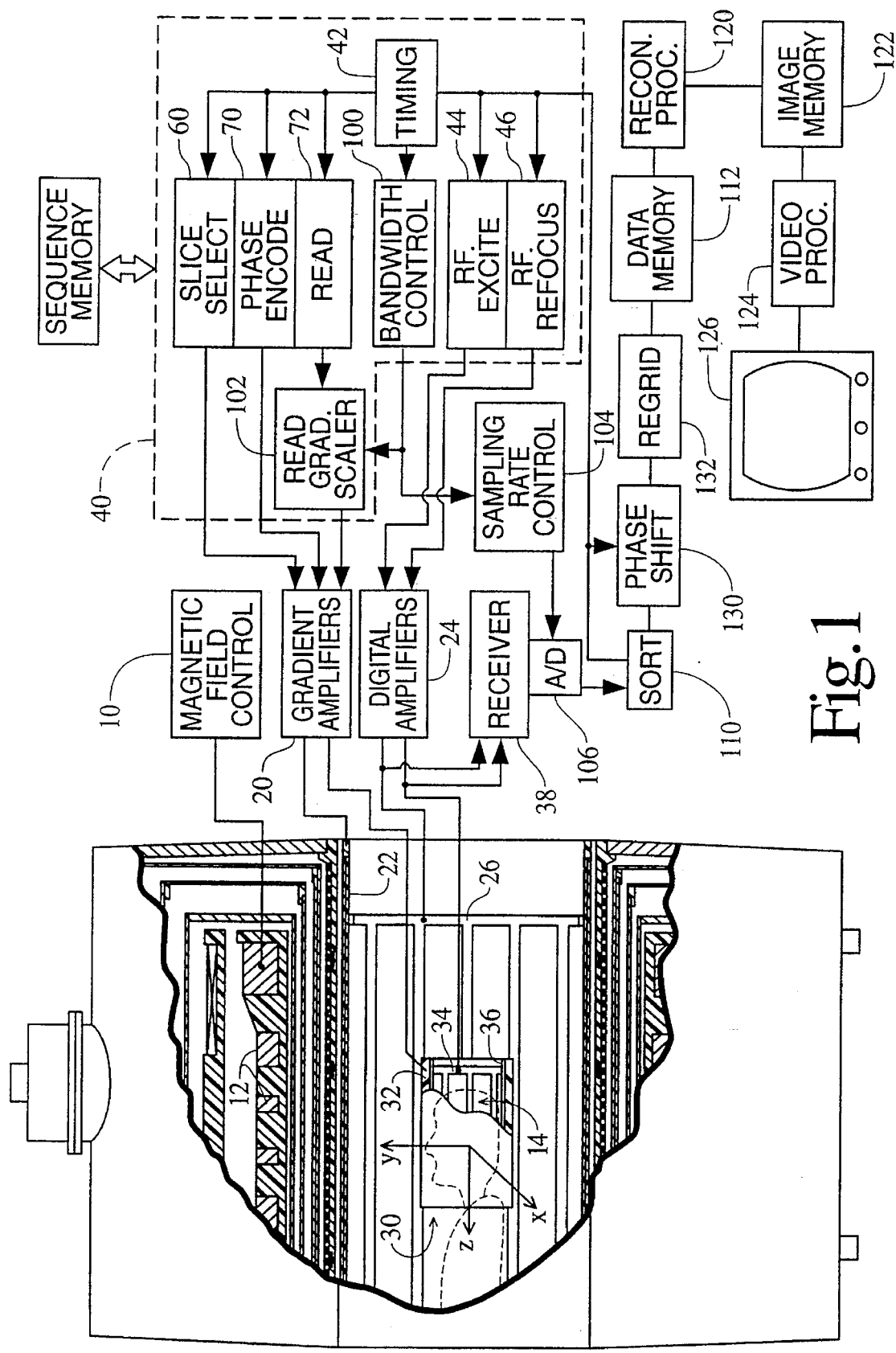
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses or pulse packets to a whole body RF coil 26 to transmit RF pulses into the examination region. A typical radio frequency pulse is composed of a packet of immediately contiguous pulse segments of short duration which taken together achieve a selected magnetic resonance manipulation. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil optionally includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used in conjunction with body-coil transmission. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38.

Figure 2:
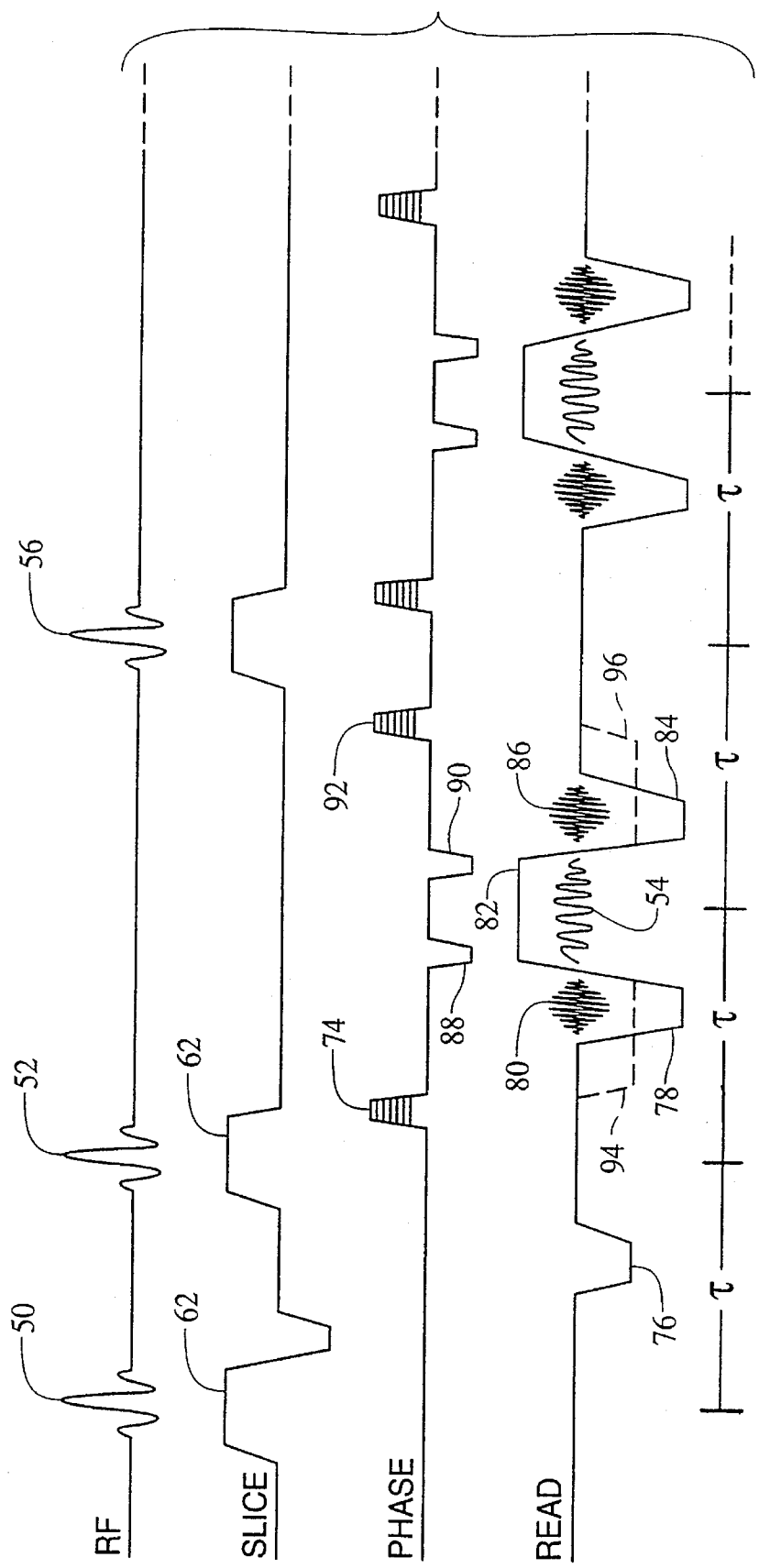
FIG. 2 is a diagrammatic illustration of an exemplary magnetic resonance imaging sequence including spin and field echoes in accordance with the present invention.

With continuing reference to FIG. 1 and further reference to FIG. 2, a sequence control circuit 40 controls the gradient pulse amplifiers 20, the transmitter 24 to generate one of a plurality of pulse sequences loaded from a sequence memory, such as the sequence illustrated in FIG. 2. A clock or timing generator 42 controls an excitation RF pulse generator 44 and a refocusing RF pulse generator 46. The resonance excitation pulse generator 44 controls the radio frequency transmitter to cause a resonance excitation RF pulse 50 to be applied to the imaging region. The refocusing RF pulse generator 46 causes the radio frequency transmitter to generate a refocusing pulse 52, e.g., at a time T after the excitation pulse. The excitation pulse followed by a refocusing pulse causes a spin echo 54 to occur a time 2τ after excitation.

In order to create a repeated echo sequence, the refocusing pulse generator 46 further generates one or more additional refocusing pulses 56 at 2τ time intervals after the preceding refocusing pulse.

The timing generator 42 also controls a slice select gradient control 60 which controls the gradient amplifiers 20 to cause slice select gradient pulses 62 concurrently with the RF excitation and refocusing pulses. The slice select gradients are used in a single or multiple-slice examination procedure to limit the excitation to a single slice. Alternately, a slab selection pulse may be applied to limit excitation to a slab that is several slices in thickness. The slab is encoded in three-dimensions with a combination of phase and read gradients.

The timing control further controls a phase-encode gradient controller 70 and a read gradient control 72. The phase-encode, gradient controller 70 causes the gradient amplifiers 20 to cause an initial phase encode gradient 74 with one of a plurality of phase encode gradient amplitude steps. The read gradient controller causes a first read gradient 76 which is reversed to form an opposite plurality read gradient 78. The gradient reversal induces first field or gradient echo 80. The read gradient is again reversed to apply a read gradient 82 which is centered about the spin echo 54. The read gradient is reversed again to an opposite polarity read gradient 84 inducing a second field echo 86. The phase-encode gradient amplifier applies phase-encode gradients 88, 90 to change the phase-encoding between the field and spin echoes. A phase-unwrapping gradient pulse 92 is equal and opposite to the sum of the phase-encodings applied by phase-encode gradient pulses 74, 88, and 90 such that the net phase-encoding is zeroed prior to application of the net refocusing pulse 56. Thereafter, a like sequence is applied one or more times.

In the prior art, the gradient pulse applied during the field echoes 78 and 84 would have been equal in magnitude and duration (but of the opposite polarity) to the read gradient 82 applied during the spin echo as illustrated in phantom in FIG. 2 at 94 and 96. However, in the present invention, a bandwidth controller 100 adjusts the bandwidth at which each of the field and spin echoes is collected. More specifically, the bandwidth controller 100 controls a read gradient scaler 102 which scales the read gradient profiles, particularly increases its magnitude and shortens its duration relative to the prior art. The bandwidth controller controls a sampling rate controller 104 which controls the sampling rate at which the field echoes are sampled. The sampling rate controller 104 typically adjusts the sampling rate of analog-to-digital converters 106 which digitize the received signal from the field echoes. If the receiver 38 is an analog receiver, the analog-to-digital converters 106 typically follow the receiver. Alternately, the analog-to-digital converters may be disposed between the radio frequency coil and a digital receiver or incorporated within a digital receiver. In the illustrated embodiment, the read gradient scaler 102 doubles the magnitude and halves the width of the profiles of the read gradient pulses 78 and 84 relative to the read gradient pulse 82 applied during the spin echo and the sampling rate controller 104 doubles the sampling rate, e.g., from 32 MHz to 64 MHz. Of course, other proportional adjustments in the read gradient scaling and sampling rates are also contemplated. It is preferred that the area under the field echo and spin echo read gradients remain constant so that the spatial resolution and field-of-view do not change.

Figure 3:
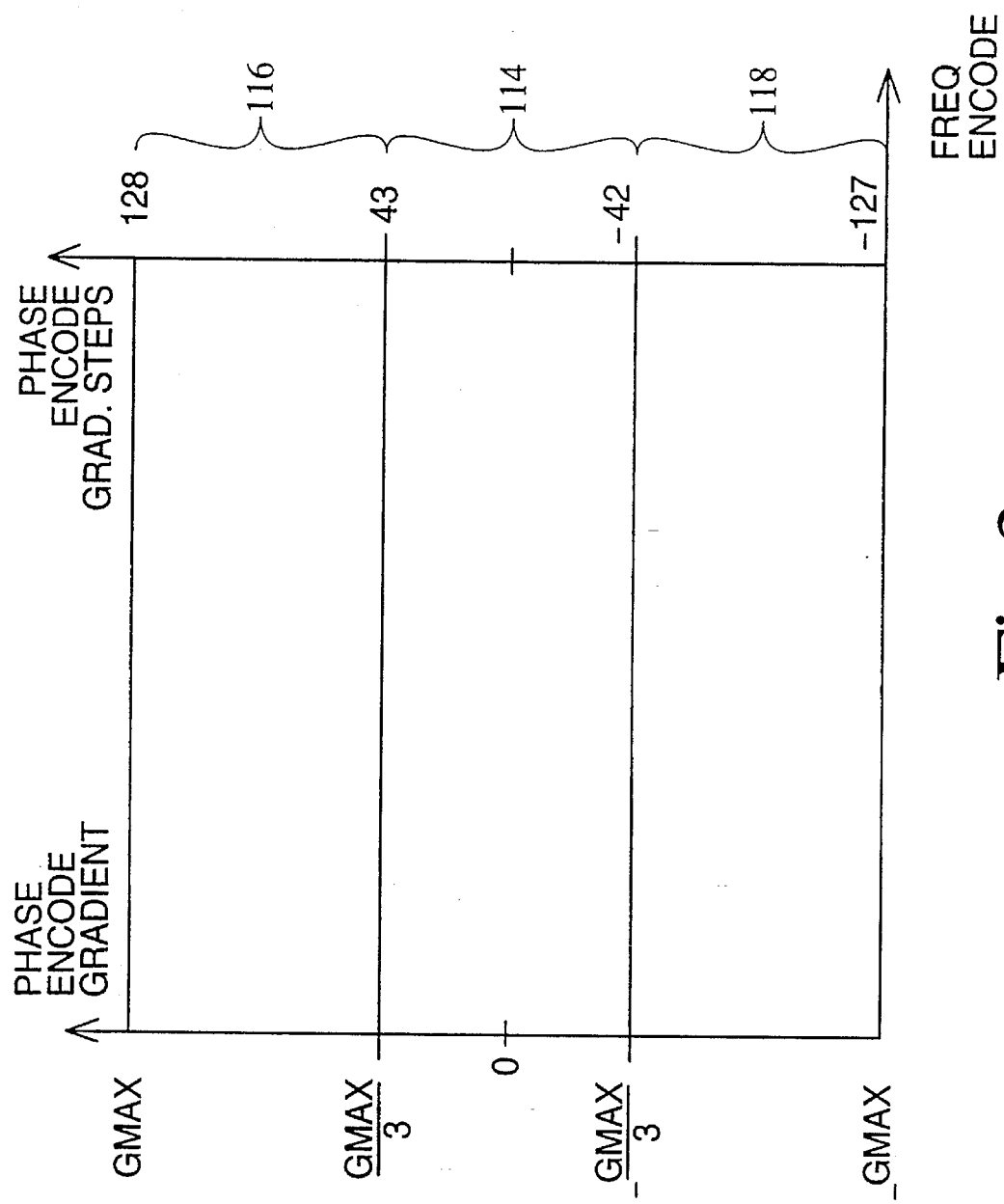
FIG. 3 illustrates a segmentation of k-space in accordance with the present invention; and, FIG. 4 illustrates an alternate magnetic resonance sequence embodiment for echo-planar imaging.

With continuing reference to FIGS. 1 and 2 and further reference to FIG. 3, a sorting routine 110 sorts each of the data lines into a data memory 112. More specifically, the sequence control 40 controls the amplitude of phase-encode gradient pulses 74 and 88 relative to each other such that the spin echo has a phase-encoding near the center of k-space, e.g., adjacent a zero phase-encoding between ⅓ of the maximum negative phase-encoding and ⅓ of the maximum positive phase-encoding. The phase-encode gradient 74 and 90 are applied such that the field echoes have phase-encoding between the spin echo phase-encodings and the maximum positive and negative phase-encodings, e.g., between the maximum negative phase-encoding and ⅓ of the maximum negative phase-encoding and between the ⅓ of the maximum positive phase-encoding and the maximum positive phase-encoding. By way of a more concrete example, if there are 256 phase-encoding steps, the phase-encode gradient 74 would be adjusted to cause the first field echo 80 to have a phase-encoding between steps 44 and 128. The second phase-encoding gradient would be adjusted to remove about half of the phase-encoding such that the spin echo 54 has a phase encoding between step −42 and step +43. The phase-encode gradient 88 may be held constant at the equivalent of −85 phase-encoding steps such that a center ⅓ of k-space 114 is filled in the same order as a top ⅓ of k-space 116. Alternately, the second phase-encode gradient 88 may be changed such that the spin echo fills its ⅓ of k-space in a different order. The phase-encode gradient 90 analogously adjusts the phase-encoding such that the second field echo 86 takes on the phase-encodings in a lower ⅓ of k-space 118. Again, the phase-encode gradient 90 may subtract roughly 85 steps of phase-encoding such that the bottom ⅓ is covered in the same order as the upper and center ⅓, or may be varied to cover the bottom ⅓ of k-space in a different order.

Of course, the read gradient may be reversed a different number of times to provide only a single field echo or more times to provide more than two field echoes contemporaneously with each spin echo. For example, by doubling the sampling bandwidth and halving the duration of the field echoes, twice as many field echoes can be acquired per spin echo with only the prior art degradation caused by $T_2^*$ phase errors. By increasing the bandwidth still higher, four field echoes can be acquired while still improving the phase-error degradation. When the relative number of field and spin echoes is changed, the segmentation of k-space is changed accordingly. Further, in some applications it may be appropriate to increase the bandwidth of the spin echo sampling and reduce the bandwidth of the field echo samplings.

Once the data is sorted into the appropriate k-space format in the data memory 112, a reconstruction processor 120 reconstructs the data after phase correction using a two-dimensional Fourier transform reconstruction algorithm into an image representation that is stored in an image memory 122. A video processor 124 retrieves selected portions of the reconstructed image representation and formats it in appropriate format for display on a human-readable monitor 126, such as a video monitor, active matrix monitor, liquid crystal display, or the like.

As described above, in the present application the magnetic resonance data lines are acquired with different sampling rates. The final image is reconstructed from a set of data with mixed bandwidth. Although FIG. 2 describes the invention in terms of a sequence with mixed spin and field echoes, it is to be appreciated that the present invention applies to sequences with one or more field echoes, one or more spin echoes, or combinations thereof. The preferred imaging read-out gradient profile amplitudes $G_{rd}(p)$ during data sampling of an echo (p) are not the same for all echoes. Similarly, the data sampling intervals $\Delta t(p)$ within each echo are different from echo to echo, depending on the read gradient amplitude. In order for all gradients to view a common field-of-view, the data sampling interval, field-of-view, and gradient amplitude are related as:

$$G_{rd}(p) FOV \Delta t(p) = 1 \qquad (1),$$

where FOV denotes the field-of-view in the direction of the read-out gradient. A number of complex data points $N_{ds}$ sampled at intervals $\Delta t(p)$ for each echo is constant. The data sampling time $T_{ds}(p)$ over complete echo (p) is:

$$T_{ds}(p) N_{ds} \cdot \Delta t(p) \qquad (2),$$

where (p) is the echo index. The final two-dimensional complex raw data is obtained by combining such digitally-sampled data into the data memory 112 for later image reconstruction. To minimize discontinuities between segments of k-space, both phase correction and time shift are applied to the data lines belonging to different segments by a correction circuit 130.

For two-dimensional Fourier reconstruction with multiple echoes, the initial imaging excitation by a slice selective RF pulse induces magnetization of a three-dimensional object with a proton nuclear spin density $\rho(x,y,z)$. Assuming that an acquired induction signal or raw data line is labeled by the corresponding view and echo and slice number as:

$$R(t,p,q,s) = \qquad (3)$$

$$\int \rho(x,y,z) \delta(Z - s\Delta z) e^{i(G_{rd}Xt + \Delta B(x,y,z)t + \frac{2\pi pY}{FOV}) - \frac{qTE}{T_2}} dxdy,$$

where t,p,q, and s denote the sampling time, view index, echo number, and slice numbers, respectively, $G_{rd}(p)$ is a time dependent magnetic field gradient (read-out) during data acquisition of the echo p, the slice profile denoted by the function $\delta(z)$, and $\Delta B(x,y,z)$ denotes main field inhomogeneity which includes the contribution of both magnet and susceptibility. The transverse spin relaxation is taken into account by $T_2$. Eddy current effect is not included in Equation (3).

In order to combine multiple-phase-encoded data lines acquired from different echoes obtained at various echo times into one data area and to form an image free of artifacts, the phase correction on the data is performed by correction circuit 130. If the data sampling interval is uniform and the read gradient is constant during each data sampling window, data can be directly combined. In practice, each acquired data line is a discrete digital representation of a continuous reality and can be uniform or non-uniform. Due to the rise time constraint of the gradient system, the read-out gradient may have a non-constant shape over part or all of the data sampling window. The acquired data lines may be non-uniform in areas of non-constant read-out gradient. To correct for this non-uniformity, a regridding processor 132 interpolates the non-linear sampled raw data lines to a linear sampled raw data view on a preselected set of uniformly-spaced grid points. Before reconstructing the final image with a two-dimensional Fourier transform, the data from echoes of different bandwidth is properly time-shifted and phase corrected before the last Fourier transform along the phase encoding direction.

The noise level of the final composite image is a blend of the noise levels of the relatively noisier high bandwidth sample data and the low bandwidth sample data. More specifically, for a set of data samples obtained as $R_i$, where $i=1,2,\ldots,n$, with a mean of $\mu_0$ and a variance of $\sigma_i^2$, the noise level of the mixed bandwidth data is given by:

$$\sigma^2 = \frac{\sum_{i=1}^{n} \sigma_i^2}{n} . \tag{4}$$

By placing the lower bandwidth data at the center of k-space, the image is disproportionately weighted in favor of the lower noise data.

The present technique can be used with spin echo, field echo, 3D FSE, multiple-shot EPI, GSE, echo-volume imaging, spiral scan and other imaging sequences. For example, as illustrated in FIG. 4, to speed up a number of field echoes in an echo-planar imaging sequence, the read-out gradient sequence can start with a high amplitude short duration high bandwidth read gradient pulse 140. In subsequent repetitions 142, 144, . . . the amplitude of the read gradient pulse reduces and its duration increases proportionately such that the field-of-view remains constant. The sampling bandwidth is reduced correspondingly in each field echo, improving the signal-to-noise ratio. Finally, a center read gradient pulse 150 and a corresponding field echo 152 are at the minimum bandwidth. Thereafter, the read-out gradient pulses 154, 156, . . . start decreasing in duration and increasing in amplitude until a maximum amplitude minimum width read-out gradient pulse 160 occurs contemporaneously with a maximum bandwidth field echo 162. The phase-encode gradients 170, 172, . . . are again selected such that the data lines from the lowest bandwidth echoes are disposed near the center of k-space with higher bandwidth data lines being disposed progressively towards the edges. This sequence may be analogously adapted to spin echoes as well.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging system including a magnet which generates a temporally constant magnetic field through an examination region, gradient magnetic field coils and a gradient magnetic field controller which generates at least phase and read magnetic field gradient pulses in orthogonal directions across the examination region, a radio frequency pulse controller and digital transmitter which induce dipoles in the examination region to resonance such that radio frequency resonance signals are generated, a receiver which receives and demodulates the radio frequency magnetic resonance signals to produce a series of data lines, the receiver being associated with an analog-to-digital converter such that the data lines are digital, a data memory which stores the digital data lines, and a reconstruction processor which reconstructs the data lines from the data memory into an image representation, the improvement comprising:

a read gradient scaler which scales amplitude and width of selected read gradient pulses such that a bandwidth of the radio frequency magnetic resonance signals received during the scaled read gradient is altered;

a sampling rate control which controls a sampling rate of each received radio frequency magnetic resonance signal in accordance with the change in bandwidth; and, the gradient magnetic field and radio frequency pulse controllers being controlled such that data lines with the lowest bandwidth are phase-encoded with the smallest phase-encoding angles and data lines with the greatest positive and negative phase-encoding angles have the highest bandwidth.

2. In the magnetic resonance imaging system as set forth in claim 1, the improvement further comprising:

a data line sorter for sorting the digital data lines in accordance with bandwidth and supplying the sorted data lines to the data memory.

3. In a method of magnetic resonance imaging in which magnetic resonance is excited in selected dipoles, and magnetic resonance echoes are induced, the induced magnetic resonance echoes are read-out along a first axis in the presence of a read gradient, the magnetic resonance echoes are digitized and demodulated to form digital data lines, the data lines are stored and reconstructed by a reconstruction algorithm to generate an image representation, the improvement comprising:

reading-out a first of the magnetic resonance echoes with a first sampling rate in the presence of a first read gradient of a first amplitude to generate a first digital data line with a first bandwidth and reading-out a second of magnetic resonance echoes with a second sampling rate faster than the first sampling rate in the presence of a second read gradient of a second amplitude larger than the first read-out gradient amplitude to generate a second digital data line of a second bandwidth higher than the first bandwidth, the digital data lines of the first and second bandwidths being reconstructed to form a common resultant image representation.

4. In the magnetic resonance imaging method as set forth in claim 3, the improvement further comprising:

following magnetic resonance excitation, applying a first phase-encode gradient along a second axis orthogonal to the first axis;

following application of the first phase-encode gradient, applying the first read gradient in the presence of the first echo to generate the first digital data line;

following the first read gradient, applying the second read gradient in the presence of the second echo before application of a subsequent excitation of magnetic resonance, whereby the digital data lines of the first and second bandwidth are generated in a common repetition of a magnetic resonance imaging sequence.

5. In a magnetic resonance imaging method in which magnetic resonance is excited in selected dipoles, and magnetic resonance echoes are induced, the induced magnetic resonance echoes are read-out along a first axis in the presence of a read gradient, the magnetic resonance echoes are digitized and demodulated to form digital data lines, the data lines are stored and reconstructed by a reconstructed algorithm to generate an image representation, the improvement comprising:

following magnetic resonance excitation, applying a first phase-encode gradient along a second axis orthogonal to the first axis;

following application of the first phase-encode gradient, applying a first read gradient of a first amplitude in the presence of a first echo to generate a first digital data line with a first bandwidth;

following the first read gradient, applying a second phase encode gradient along the second axis;

after the second phase encode gradient, applying a second read gradient of a second amplitude different from the first read-out gradient amplitude in the presence of a second echo before application of a subsequent excitation of magnetic resonance to generate a second digital data line of a second bandwidth different from the first bandwidth, such that the first and second echoes have different phase encodings;

reading-out the first of the magnetic resonance echoes with a first sampling rate in the presence of the first read gradient;

reading-out the second of magnetic resonance echoes with a second sampling rate faster than the first sampling rate in the presence of the second read gradient;

the digital data lines of the first and second bandwidths reconstructing to form a common resultant image representation.

6. In a magnetic resonance imaging method in which magnetic resonance is excited in selected dipoles, and magnetic resonance echoes are induced, the induced magnetic resonance echoes are read-out along a first axis in the presence of a read gradient, the magnetic resonance echoes are digitized and demodulated to form digital data lines, the data lines are stored and reconstructed by a reconstruction algorithm to generate an image representation, the improvement comprising:

reading-out a first of the magnetic resonance echoes with a first sampling rate in the presence of a first read gradient of a first amplitude to generate a first digital data line with a first bandwidth and reading-out a second of magnetic resonance echoes with a second sampling rate faster than the first sampling rate in the presence of a second read gradient of a second amplitude different from the first read-out gradient amplitude to generate a second digital data line of a second bandwidth different from the first bandwidth;

after the second read gradient, inducing a third magnetic resonance echo and applying a third read gradient pulse of a third amplitude contemporaneously with the third echo, the first and third read gradients having a common amplitude greater than the amplitude of the second read gradient;

reading-out the third echo at a third sampling rate to generate a third data line having a third bandwidth, the first and third sampling rates being the same and higher than the second sampling rate such that the first and the third bandwidths are the same and higher than the second bandwidth;

reconstructing the data lines to form a common resultant image representation.

7. In the magnetic resonance imaging method as set forth in claim 6, the improvement further comprising:

exciting magnetic resonance by applying a first radio frequency excitation pulse;

applying a radio frequency refocusing pulse;

timing the radio frequency excitation pulse, the radio frequency refocusing pulse, and the first, second, and third read gradients such that the second echo is a spin echo.

8. In the magnetic resonance imaging method as set forth in claim 7, the improvement further comprising:

the first and third echoes being field echoes.

9. In the magnetic resonance imaging method as set forth in claim 6, the improvement further comprising:

applying phase-encode gradient pulses between the first and second echoes and between the second and third echoes such that the second echoes are phase encoded with a smaller phase-encode angle than the first and third echoes.

10. In the magnetic resonance imaging method as set forth in claim 6, the improvement further comprising:

inducing a fourth echo after the third echo and before the subsequent excitation of magnetic resonance, and applying a fourth read gradient of a fourth amplitude in the presence of the fourth echo;

reading-out the fourth echo at a fourth sampling rate to generate a fourth data line having a fourth bandwidth.

11. In the magnetic resonance imaging method as set forth in claim 10, the improvement further comprising:

the first, second, third, and fourth gradient amplitudes and the first, second, third, and fourth sampling rates changing progressively such that the first, second, third, and fourth digital data lines bandwidth change progressively between a lowest and highest bandwidth;

phase-encoding the first, second, third, and fourth echoes such that in each repetition, the echoes which produce the lowest bandwidth digital data lines have the lowest phase-encoding angles and the echoes which produce the highest bandwidth digital data lines have the largest phase-encoding angles.

12. A method of magnetic resonance imaging comprising:

(a) exciting magnetic resonance in selected dipoles;

(b) applying a radio frequency refocusing pulse to induce a spin echo;

(c) reversing polarity of a read gradient to induce a field echo;

(d) reading-out the field echo with a first sampling rate in the presence of a first read gradient with a first amplitude to generate a first data line with a first bandwidth;

(e) reading-out the spin echo with a second sampling rate in the presence of a second read gradient of a second amplitude different from the first read-out gradient amplitude to generate a second data line of a second bandwidth different from the first bandwidth;

(f) repeating at least steps (b)–(e) a plurality of times to generate a plurality of first and second data lines; and, (g) reconstructing an image representation from the plurality of data lines.

13. The magnetic resonance imaging method as set forth in claim 12 further including:

inducing another field echo;

reading out the another field echo in the presence of a third read gradient of a third amplitude to generate a third data line with a third bandwidth, the third gradient amplitude being different from the second gradient amplitude.

14. The magnetic resonance imaging method as set forth in claim 12 further including:

inducing a plurality of additional field echoes and reading-out the field echoes in the presence of read gradients to generate additional data lines.

15. The method as set forth in claim 14 wherein amplitudes of the read gradient and sampling rates change progressively with each subsequent echo such that the bandwidth of the data lines changes progressively from a lowest to a highest bandwidth.

16. The method as set forth in claim 12 further including:

applying at least one phase-encode gradient pulse prior to at least one of the echoes; and, applying a further phase encode gradient after the last echo to undo the effect of the applied phase-encode gradient pulses.

* * * * *